United States Patent [19]

Umatate et al.

[11] Patent Number: 4,780,617

[45] Date of Patent: Oct. 25, 1988

[54] METHOD FOR SUCCESSIVE ALIGNMENT OF CHIP PATTERNS ON A SUBSTRATE

[75] Inventors: Toshikazu Umatate, Kawasaki; Hiroyuki Suzuki, Tokyo, both of Japan

[73] Assignee: Nippon Kogaku K.K., Tokyo, Japan

[21] Appl. No.: 915,027

[22] Filed: Oct. 3, 1986

Related U.S. Application Data

[63] Continuation-in-part of Ser. No. 760,037, Jul. 29, 1985, abandoned.

[30] Foreign Application Priority Data

Aug. 9, 1984 [JP] Japan .................................. 59-167020
Oct. 8, 1985 [JP] Japan .................................. 60-224163

[51] Int. Cl.$^4$ ...................... G01B 11/26; G05B 15/00; G05D 3/00
[52] U.S. Cl. ..................................... 250/548; 356/401; 364/491; 364/559
[58] Field of Search ................... 250/548, 557, 237 R; 356/399, 400, 401; 364/559, 490, 491

[56] References Cited

U.S. PATENT DOCUMENTS 4,342,090 7/1982 Caccoma et al. .................. 364/559
4,362,385 12/1982 Lobach .............................. 250/548

Primary Examiner—Edward P. Westin
Attorney, Agent, or Firm—Shapiro and Shapiro

[57] ABSTRACT

A method for successive alignment of each of a plurality of chip patterns regularly arranged on a substrate to a reference position comprises moving the substrate so as to successively make selected chip patterns correspond to the reference position in accordance with design data representative of the positions of the selected chip patterns, measuring the positions of the selected chip patterns when made to correspond to the reference position, determining on the basis of the measured positions, coefficients of an operational equation so that the sum of the square of deviations between positions of the selected chip patterns determined by use of the operational equation and positions of the selected chip patterns represented by design data may be minimum, determining positions corresponding to the plurality of chip patterns on the basis of the operational equation, and moving the substrate in accordance with the determined positions.

14 Claims, 9 Drawing Sheets

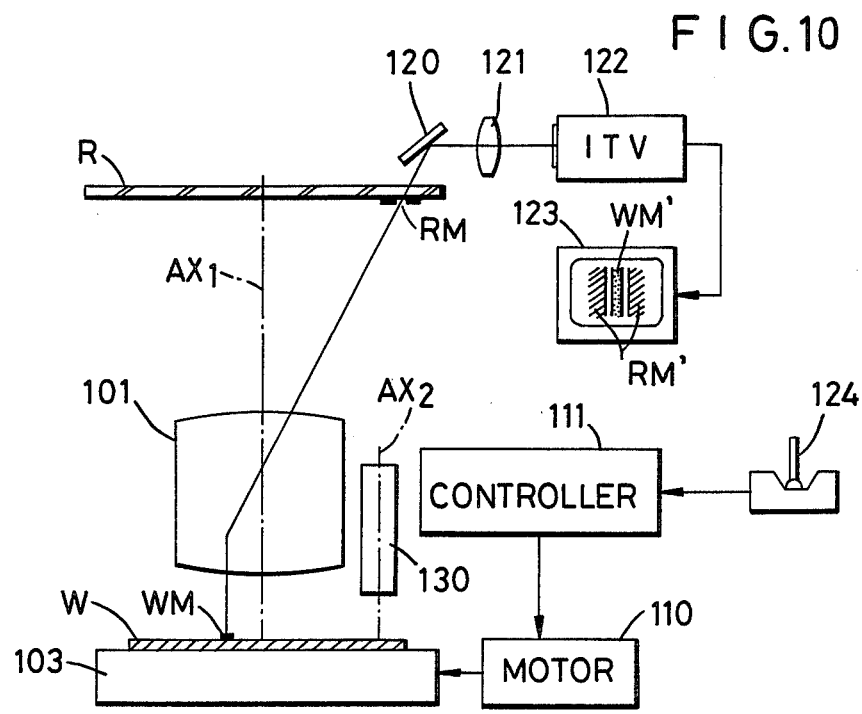
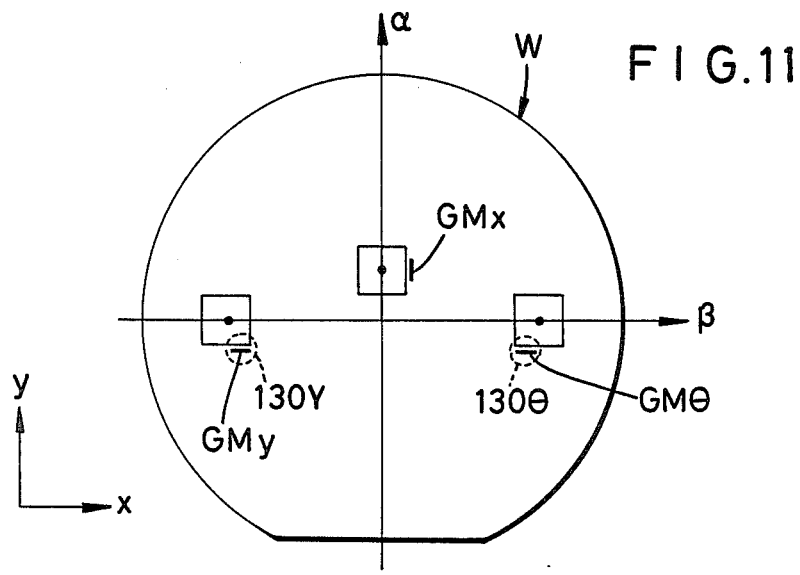

METHOD FOR SUCCESSIVE ALIGNMENT OF CHIP PATTERNS ON A SUBSTRATE

CROSS-REFERENCE TO RELATED APPLICATION

This application is a continuation-in-part of U.S. application Ser. No. 760,037, filed on July 29, 1985, now abandoned. (incorporated herein by reference).

BACKGROUND OF THE INVENTION

1. Field of the Invention

This invention relates to an alignment method suitable for an exposure apparatus of the step-and-repeat type for manufacturing semiconductive devices or an apparatus for successively effecting inspections by the step-and-repeat system, and in particular to a method of effecting precise alignment of a mask or a reticle which provides a negative for exposure and a semiconductive wafer or the like which is an object to be exposed.

2. Description of the Prior Art

In recent years, the tendency of semiconductive devices such as IC and LSI toward minuteness and higher density has rapidly progressed, and higher accuracy has been required of apparatuses for manufacturing the semiconductive devices, particularly, exposure apparatuses in which the circuit pattern of a mask or a reticle is superposedly transferred onto a circuit pattern formed on a semiconductor wafer. It is required that the circuit pattern of the mask and the circuit pattern on the wafer be superposed one upon the other, for example, with accuracy within 0.1 $\mu$m and therefore, nowadays, apparatuses of the so-called step-and-repeat type in which the circuit pattern of a mask is exposed to a localized area (for example, an area corresponding to a chip) on a wafer, whereafter the wafer is caused to effect stepping by a predetermined distance and then the circuit pattern of the mask is again exposed, particularly, reduction projection type exposure apparatuses (steppers), have become the main current of the exposure apparatuses of this kind. In this step-and-repeat system, the wafer is placed on a two-dimensionally movable stage and positioned relative to the projected image of the circuit pattern of the mask and therefore, the projected image and each chip on the wafer can be precisely superposed one upon the other. Also, in the case of the reduction projection type exposure apparatus, there are two methods, namely, the through-the-lens type alignment method whereby alignment marks provided on a mask or a reticle and marks attendant to the chips on a wafer are directly observed or detected through a projection lens to thereby accomplish alignment, and the off-axis type alignment method whereby alignment of an entire wafer is effected by the use of an alignment microscope provided at a predetermined distance from a projection lens, whereafter the wafer is fed to just beneath the projection lens. Generally, the through-the-lens system has a merit that the super-position accuracy is high because alignment is effected for each chip on the wafer, but suffers from a problem that the exposure processing time of a wafer is long. In the case of the off-axis system, once alignment of the entire wafer has been completed, the wafer need only be caused to effect stepping in accordance with the arrangement of the chips and therefore, the exposure processing time is shortened. However, the alignment of each chip is not effected and therefore, satisfactory superposition accuracy has not always been obtained under the influence of the expansion and contraction of the wafer, the rotation error of the wafer on the stage, the degree of orthogonality of movement of the stage itself, etc.

SUMMARY OF THE INVENTION

It is an object of the present invention to provide a method which, in the step-and-repeat type alignment, enables more precise alignment to be accomplished simply by stepping without effecting the alignment of the projected position or the like of the pattern of a mask with a reference position with respect to all of a plurality of chips arranged on a substrate to be processed, such as a wafer.

The present invention can be widely applied to reduction projection type exposure apparatuses, one-to-one magnification projection type steppers and proximity type steppers. In addition to exposuree apparatuses, the present invention can be likewise carried out in apparatuses for inspecting a semiconductive wafer or a photomask having a plurality of chip patterns and in which, for each chip, alignment to a reference position such as the inspection field or the probe is effected by the step-and-repeat system.

In one of its aspects, the present invention is a method for successive alignment of each of a plurality of chip patterns regularly arranged on a substrate in accordance with predetermined coordinates to a reference position, the method comprising the steps of:

(a) moving said substrate so as to successively make selected several of said plurality of chip patterns correspond to said reference position in accordance with design data representative of the coordinates position of each of said plurality of chip patterns;

(b) measuring the positions of said selected several chip patterns when made to correspond to said reference position;

(c) determining, on the basis of the measured positions, coefficients of an operational equation so that the sum of the square of deviations between positions of said selected chip patterns determined by use of the operational equation and positions of said selected chip patterns represented by said design data may be minimum;

(d) determining positions corresponding to said plurality of chip patterns on the basis of said operational equation; and (e) moving said substrate in accordance with said determined positions.

In a preferred embodiment of the present invention, a conversion matrix A including the residual rotation error $\theta$ of the wafer, the degree of orthogonality $\omega$ of the stage and the linear expansion and contraction R of the wafer and a matrix O of the amount of two-dimensional offset of the wafer are used as said parameter.

In another preferred mode of the present invention, when regularity in the arrangement of the pattern on the substrates is determined for each of the substrates in accordance with the design values and the actually measured values of the position of said pattern, all of a plurality of parameters for determinating the regularity are determined on the basis of the actually measured values with respect to each of the substrates from the first substrate for the processing to the m-th one (in this case m<N) out of N pieces of substrate. With respect to each of the substrates on and after the (m+1)th one, only a parameter with a value variable for each substrate out of a plurality of parameters is determined on the basis of the actually measured value for each substrate. To the other parameters the parameters already determined on the substrates from the first to the m-th are applied.

BRIEF DESCRIPTION OF THE DRAWINGS

FIG. 10 is a view showing an outline of the construction of a suitable stepper for another embodiment of the present invention.

FIG. 11 is a plan view showing the mark arrangement on the wafer to be processed by the stepper in FIG. 10.

DESCRIPTION OF THE PREFERRED EMBODIMENTS

Figure 1:
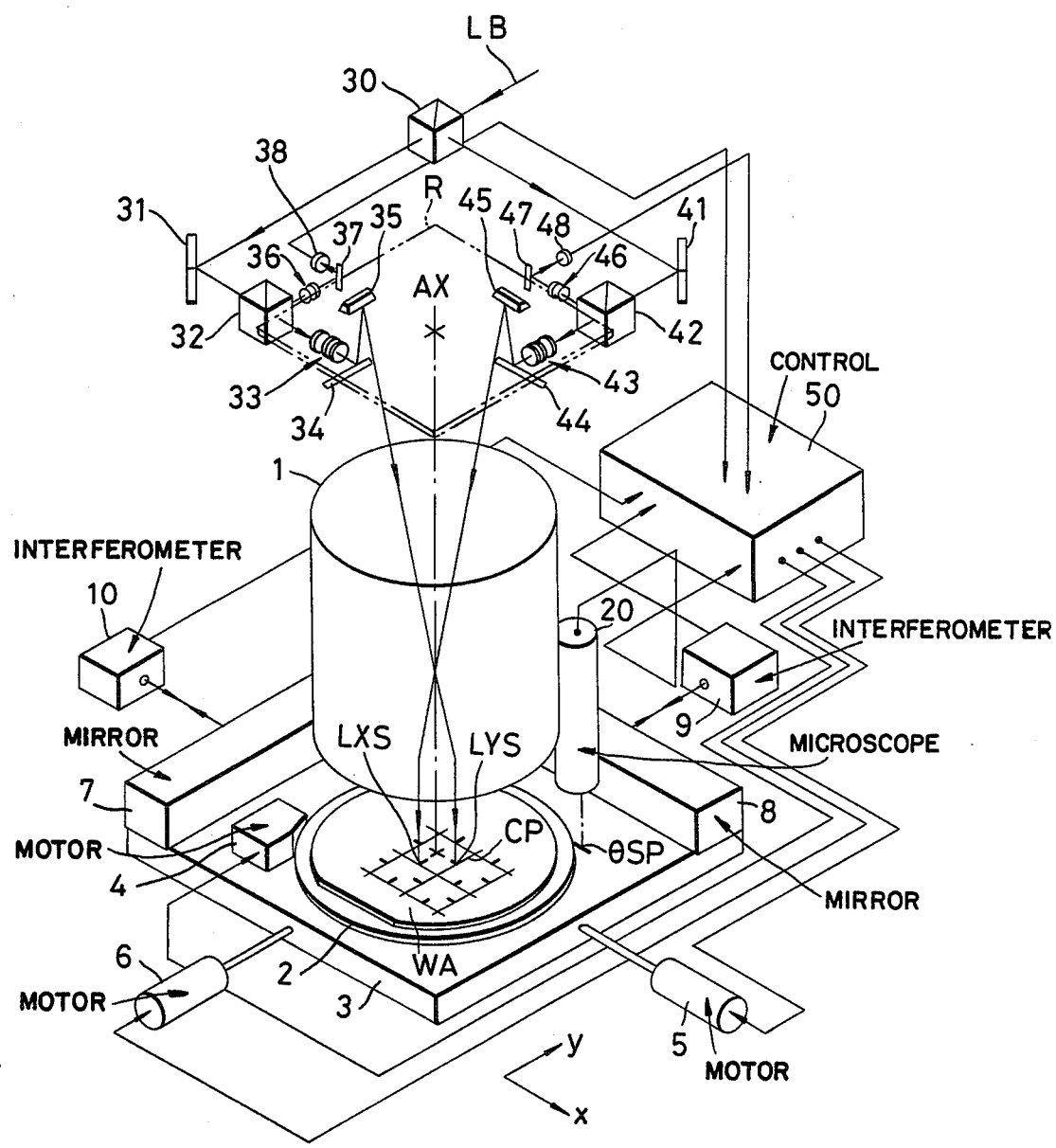
FIG. 1 is a perspective view schematically showing the construction of a reduction projection type exposure apparatus suitable for carrying out the method of the present invention.
Figure 2:
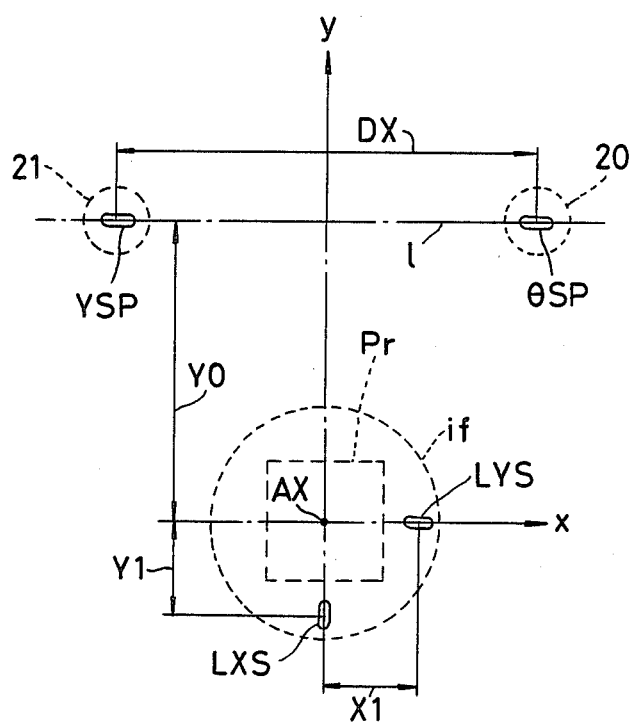
FIG. 2 is a plan view showing the positional relation between the centers of detection of the alignment system in the apparatus of FIG. 1.

FIG. 1 schematically shows the construction of a reduction projection type exposure apparatus. A reticle R which provides a projection negative is mounted on the apparatus with the center of projection thereof being positioned so as to pass through the optic axis of a projection lens 1. The projection lens 1 projects a circuit pattern image depicted on the reticle R onto a wafer WA while reducing it to 1/5 or 1/10. A wafer holder 2 vacuum-adsorbs the wafer WA and is provided for slight rotation relative to a stage 3 two-dimensionally movable in X direction and y direction. A drive motor 4 is fixed on the stage 3 and rotates the wafer holder 2. The movement of the stage 3 in x direction is effected by the driving of a motor 5, and the movement of the stage 3 in y direction is effected by the driving of a motor 6. A reflecting mirror 7 having its reflecting surface extending in y direction and a reflecting mirror 8 having its reflecting surface extending in x direction are secured to the two orthogonal sides of the stage 3. A laser interferometer 9 projects a laser light onto the reflecting mirror 8 and detects the position (or the amount of movement) of the stage 3 in y direction, and a laser interferometer 10 projects laser light onto the reflecting mirror 7 and detects the position (or the amount of movement) of the stage 3 in x direction. Off-axis type wafer alignment microscopes 20 and 21 are provided laterally of the projection lens 1 to detect (or observe) an alignment mark on the wafer WA. The microscope 21 is provided behind the projection lens 1 in FIG. 1 and is not shown. The microscopes 20 and 21 have optic axes parallel to the optic axis AX of the projection lens 1 and image on the wafer WA band-like laser light spots YSP and $\theta$SP elongaged in x direction as shown in FIG. 2. These light spot YSP and $\theta$SP are light of a wavelength which does not sensitize the photosensitive agent (photoresist) on the wafer WA and in the present embodiment, they vibrate in y direction with a minute amplitude. Each of the microscopes 20 and 21 has a photoelement element receiving the scattered light and diffracted light from the mark and a circuit for synchronizing and rectifying the photolectric signal thereof at the vibration period of the light spot, and puts out an alignment signal corresponding to the amount of deviation of the mark in y direction relative to the center of vibration of the light spot in y direction.

The present apparatus is provided with a laser step alignment optical system for detecting the mark on the wafer WA through the projection lens 1. A laser beam LB emitted from a laser light source, not shown, and passed through an expander, a cylindrical lens, etc., not shown, is a light of wavelength which does not sensitize the photoresist, and enters a beam splitter 30 and is divided into two light beams thereby. One of the two laser beams is reflected by a mirror 31, passes through a beam splitter 32 and is converged by an imaging lens group 33 so that it becomes a light spot whose cross-section is like a band, whereafter it enters a first turn-back mirror 34 disposed between the reticle R and the projection lens 1 so as not to intercept the projection optical path of the circuit pattern. The mirror 34 reflects the laser beam upwardly toward the reticle. That laser beam enters a mirror 35 provided below the reticle and having a reflecting surface parallel to the surface of the reticle, and is reflected toward the center of the entrance pupil of the projection lens 1. The laser beam from the mirror 35 is converged by the projection lens 1 and is imaged as a band-like light spot LYS elongated in x direction on the wafer WA. The light spot LYS is used to scan a diffraction grating-like mark extending in x direction on the wafer relatively in y direction and detect the position of that mark. When the light spot LYS irradiates the mark, diffracted light is created from the mark. The light information again returns to the projection lens 1, the mirror 35, the mirror 34 and the imaging lens group 31, is reflected by the beam splitter 32 and enters an optical element 36 comprising a condensing lens and a space filter. This optical element 36 transmits therethrough the 1st-order and higher order diffracted light from the mark, intercepts the regularly reflected light and condenses the diffracted light on the light receiving surface of a photoelectric element 38 through a mirror 37. The photoelectric element 38 puts out a photoelectric signal corresponding to the quantity of the diffracted light condensed. The above-described elements 31–38 together constitute a through-the-lens type alignment optical system (hereinafter referred to as the Y-LSA system) for detecting the position of the mark on the wafer in y direction.

On the other hand, the other laser beam divided by the beam splitter 30 enters a through-the-lens type alignment optical system (hereinafter referred to as the X-LSA system) for detecting the position of the mark on the wafer in x direction. The X-LSA system, just like the Y-LSA system, is comprised of a mirror 41, a beam splitter 42, an imaging lens group 43, mirrors 44, 45, an optical element 46, a mirror 47 and a photoelectric element 48, and images on the wafer WA a band-like light spot LXS elongated in y direction.

A main control device 50 receives as inputs the photoelectric signals from the photoelectric elements 38, 48, the alignment signals from the microscopes 20, 21 and the position information from the laser interferometers 9, 10 and carries out various operational processings for alignment and also puts out a command for driving the motors 4, 5 and 6. This main control device 50 is provided with an operational processing unit such as a microcomputer or a minicomputer, which stores therein the design position information of a plurality of chips CP formed on the wafer, namely, the chip arrangement coordinates value on the wafer WA.

FIG. 2 shows the arrangement relation of the light spots $\theta$SP, YSP, LYS and LXS by the microscopes 20, 21 and the Y-LSA system and the X-LSA system on the imaging plane of the projection lens 1. When the coordinates system xy with the optic axis AX as the origin is determined, the x-axis and the y-axis represent the directions of movement of the stage 3. In FIG. 2, the circular area with the optic axis AX as the center is an image field i f, and the rectangular area therewithin is the projected image Pr of the effective pattern area of the reticle R. The light spot LYS is formed within the image field but outside the projected image so as to be coincident with the x-axis, and the light spot LXS is also formed within the image field but outside the projected image so as to be coincident with the y-axis. The centers of vibration of the light spots $\theta$SP and YSP are determined so as to be coincident with a line l parallel to the x-axis and spaced apart by a distance $Y_0$ in y direction from the x-axis and so that the spacing $D_x$ therebetween is of a value smaller than the diameter of the wafer. In the present apparatus, the light spots $\theta$SP and YSP are arranged symmetrically with respect to the y-axis, and the main control device 50 stores therein the information regarding the positions of the light spots $\theta$SP and YSP relative to the projection point of the optic axis AX. The main control device 50 also stores therein the information regarding the distances X1 and Y1 from the projection point of the optic axis A to the centers of the light spots LYS and LXS.

An aligning method using this apparatus will now be described by reference to FIGS. 3 and 4. This alignment is effected with respect to the second layer and so on of the wafer, and on the wafer there are already provided chips formed during the lithograph process of the first layer and alignment marks.

The wafer WA is roughly pre-aligned at step 1 by the use of a pre-alignment apparatus, not shown so that the orientation flat of the wafer faces in a predetermined direction. The orientation flat of the wafer is positioned so as to be parallel to the x-axis as shown in FIG. 1.

Figure 5:
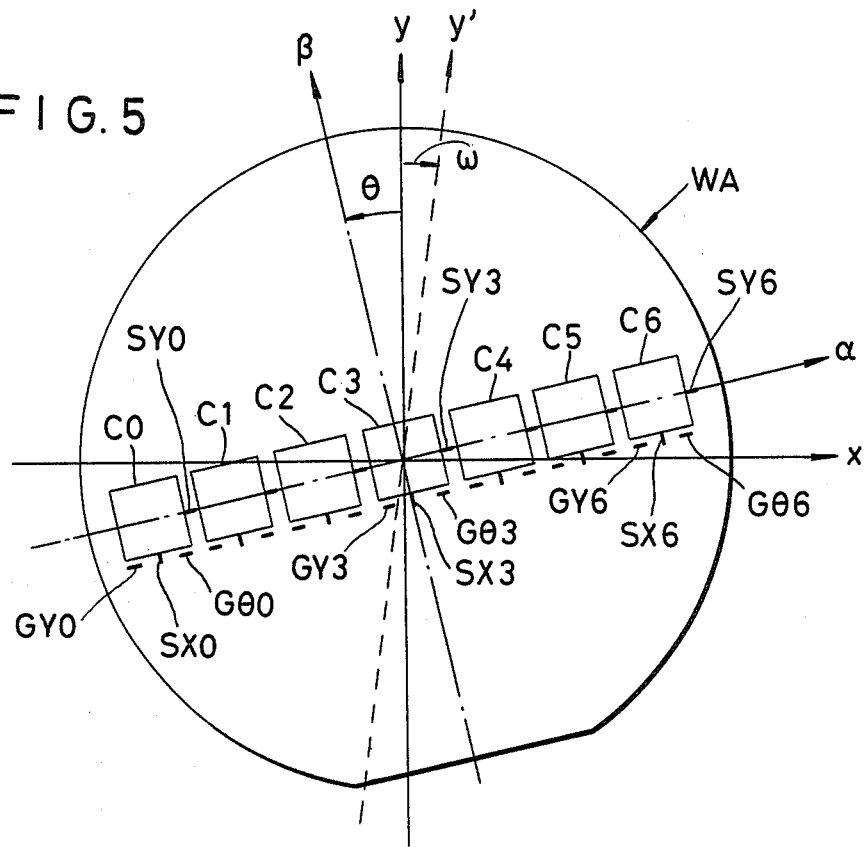
FIG. 5 is a plan view of a wafer suitable for effecting alignment and exposure by the use of the apparatus of FIG. 1.

Next, at step 2, the wafer is conveyed onto the wafer holder 2 of the stage 3 and is placed on the wafer holder 2 so that the flat of the wafer keeps parallelism to the x-axis, and is vacuum-adsorbed. On the wafer, as shown, for example, in FIG. 5, a plurality of chips Cn are formed in the form of a matrix along the orthogonal arrangement coordinates $\alpha\beta$ on the wafer. The $\alpha$-axis of the arrangement coordinates $\alpha\beta$ is substantially parallel to the flat of the wafer. In FIG. 5, of the plurality of chips Cn, only the chips $C_0$–$C_6$ arranged in a row on the $\alpha$-axis passing substantially through the center of the wafer are shown typically. Four alignment marks GY, G$\theta$, SX and SY are provided attendantly to each of the chips $C_0$–$C_6$. When the center of the middle chip $C_3$ is the origin of the arrangement coordinates $\alpha\beta$, diffraction grating-like marks $SY_0$–$SY_6$ linearly extending in $\alpha$ direction are provided on the $\alpha$-axis at the right side of the chips $C_0$–$C_6$, respectively. Also, a diffraction grating-like mark $SX_3$ linearly extending in $\beta$ direction is provided on the $\beta$-axis passing through the center of the chip $C_3$ below the chip $C_3$, and marks $SX_0$–$SX_2$ and $SX_4$–$SX_6$ are also provided on the lines passing through the centers of the other chips $C_0$, $C_1$, $C_2$, $C_4$, $C_5$ and $C_6$ and parallel to the $\beta$-axis. These marks SYn and SXn are detected by the light spots LYS and LXS, respectively. Below the respective chips $C_0$–$C_6$, there are provided marks $GY_0$–$GY_6$ and $G\theta_0$–$G\theta_6$ used to effect global alignment of the wafer. These marks GYn and G$\theta$n are formed by a diffraction grating-like pattern extending linearly in $\alpha$ direction on a line parallel to the $\alpha$-axis. Further, of the chips $C_0$–$C_6$ arranged in a row in $\alpha$ direction, for example, the spacing between the mark $GY_0$ of the leftmost chip $C_0$ and the mark $G\theta_6$ of the rightmost chip $C_6$ is determined so as to be coincident with the spacing DX between the light spots $\theta$SP and YSP by the microscopes 20 and 21. That is, in the present embodiment, global alignment of the wafer is effected in the off-axis system by the use of the two marks $GY_0$ and $G\theta_6$ spaced apart from each other. Therefore, the other marks $GY_1$–$GY_6$ and $G\theta_0$–$G\theta_5$ are unnecessary and may be dispensed with. What is essential is that two marks elongated in $\alpha$ direction may lie with the spacing DX therebetween on a line parallel to (or coincident with) the $\alpha$-axis.

The main control device 50 pre-stores therein as constants inherent to the apparatus the position information of the stage 3 when it receives the wafer from the pre-alignment apparatus and information such as the direction and amount of movement of the stage 3 until the marks $GY_0$ and $G\theta_0$ are positioned from said position within the observation fields of the microscopes 21 and 20, respectively. So, at the next step 3, the main control device 50 first drives the motors 5 and 6 and positions the stage 3 so that the mark $GY_0$ is positioned within the observation field of the microscope 21. Thereafter, the main control device 50 precisely positions the stage 3 in y direction on the basis of the alignment signal from the microscope 21 and the position information from the laser interferometer 9 so that the center of vibration of the light spot YSP becomes coincident with the center of the mark $GY_0$ in y direction. When the center of vibration of the light spot YSP becomes coincident with the center of the mark $GY_0$, the main control device 50 feedback-controls the motor 6 by the alignment signal from the microscope 21 so that said state is maintained while it drives the motor 4 to rotate the wafer holder 2 so that the mark $G\theta_6$ is detected by the light spot $\theta$SP of the microscope 20. Further, the main control device 50 servo-controls the motor 4 by the alignment signal from the microscope 20 so that the center of vibration of the light spot $\theta$SP becomes coincident with the center of the mark $G\theta_6$ in y direction. By the above-described series of operations, the light spots YSP and $\theta$SP become coincident with the marks $GY_0$ and $G\theta_6$, respectively, and the rotational misalignment of the arrangement coordinates $\alpha\beta$ of the wafer relative to the movement coordinates system of the stage 3, i.e., the coordinates system xy, is corrected and also, making the coordinates system xy correspond to the arrangement coordinates $\alpha\beta$ with respect to the position in y direction ($\beta$ direction) is completed. Subsequently, after positioned, the stage 3 is moved in x direction so that the mark $SX_3$ of the chip $C_3$ positioned at the central portion on the wafer is scanned by the light spot LXS of the X-LSA system. At this time, the main control device 50 detects and stores therein the position of the wafer in x direction when the mark SX$_3$ becomes coincident with the light spot LXS, on the basis of the time-serial photoelectric signal from the photoelectric element 48 and the position information from the laser interferometer 10. Thereby, making the coordinates system xy correspond to the arrangement coordinates αβ with respect to the position in x direction (α direction) is completed. This correspondence in x direction is unnecessary where the X-LSA system is used immediately before the exposure operation. By the above-described operations, the global alignment of the wafer (the correspondence of the arrangement coordinates αβ to the coordinates system xy) chiefly comprising the off-axis type alignment is terminated.

According to the conventional method, the main control device 50 reads the position information from the laser interferometers 9 and 10 on the basis of the arrangement design value of each chip on the wafer and effects the addressing by the step-and-repeat system of the stage 3 so that the projected image Pr of the reticle R overlaps a chip, whereafter exposure (print) is effected on that chip.

However, a shot address error is caused by irregularity of the accuracy of the alignment detecting system, the setting accuracy of each light spot or the accuracy of the position detection by the optical or shape state of each mark on the wafer before the global alignment is completed, and each chip on the wafer is not always precisely aligned (addressing) in accordance with the coordinates system xy. The above-mentioned shot address error is caused chiefly by the following four factors:

(1) Rotation of the wafer

This is due to the fact that the positional relation between the two light spots YSP and ηSP which provide the reference of alignment is not accurate, for example, when the wafer is rotation-corrected, and is represented by the amount of residual rotation error θ of the arrangement coordinates αβ relative to the coordinates system xy.

(2) The degree of orthogonality of the coordinates system xy

This is due to the fact that the directions in which the stage 3 is fed by the motors 5 and 6 are not accurately orthogonal to each other, and is represented by the amount of error of degree of orthogonality ω.

(3) Linear expansion and contraction of the wafer in x(α) direction and y(β) direction This refers to the fact that the wafter is generally expanded and contracted by the working process of the wafer. Thus, the actual chip position deviates by a minute amount in α and β directions relative to the design arrangement coordinates values of the chips, and this is particularly remarkable in the marginal portion of the wafer. The amounts of general expansion and contraction of the wafer are represented by Rx and Ry with respect to α(x) direction and β(y) direction, respectively. It is to be understood that Rx is represented by the ratio between the actually measured value and the design value of the distance between two points on the wafer in x direction (α direction) and that Ry is represented by the ratio between the actually measured value and the design value of the distance between two points on the wafer in y direction (β direction). Accordingly, when both of Rx and Ry are 1, there is no expansion or contraction.

(4) Offsets in x(α) direction and y(β) direction

These are caused by the wafer generally deviating by a minute amount in x direction and y direction due to the detection accuracy of the alignment system, the positioning accuracy of the wafer holder 2, etc., and are represented by the amounts of offset Ox and Oy. In FIG. 5, the amount of residual rotation error θ of the wafer WA and the amount of error of degree of orthogonality ω of the stage 3 are exaggeratedly shown.

In this case, the orthogonal coordinates system xy are actually an inclined coordinates system xy' inclined by a minute amount ω, and the wafer is rotated by θ relative to the orthogonal coordinates system xy. When the above-mentioned error factors (1)–(4) are applied, the shot position Fxn, Fyn for each shot relative to the design coordinates position (Dxn, Dyn) is represented as follows, in which n is an integer and represents the shot number.

$$\begin{bmatrix} Fxn \\ Fyn \end{bmatrix} = \begin{bmatrix} Rx, & 0 \\ 0, & Ry \end{bmatrix} \begin{bmatrix} \cos\theta, & -\sin\theta \\ \sin\theta, & \cos\theta \end{bmatrix} \begin{bmatrix} 1, & -\tan\omega \\ 0, & 1 \end{bmatrix} \quad (1)$$

$$\begin{bmatrix} Dxn \\ Dyn \end{bmatrix} + \begin{bmatrix} Ox \\ Oy \end{bmatrix}$$

$$= \begin{bmatrix} Rx \cdot \cos\theta, & -Rx(\cos\theta\tan\omega + \sin\theta) \\ Ry \cdot \sin\theta, & Ry(-\sin\theta\tan\omega + \cos\theta) \end{bmatrix}$$

$$\begin{bmatrix} Dxn \\ Dyn \end{bmatrix} + \begin{bmatrix} Ox \\ Oy \end{bmatrix}$$

Here, ω is originally a minute amount and θ is also driven into a minute amount by the global alignment and therefore, if linear approximation is effected, equation (1) above will be represented by equation (2) below.

$$\begin{bmatrix} Fxn \\ Fyn \end{bmatrix} = \begin{bmatrix} Rx, & -Rx(\omega + \theta) \\ Ry \cdot \theta, & Ry \end{bmatrix} \begin{bmatrix} Dxn \\ Dyn \end{bmatrix} + \begin{bmatrix} Ox \\ Oy \end{bmatrix} \quad (2)$$

From this equation (2), the positional deviation (εxn, εyn) from the design value at each shot position is represented by equation (3) below.

$$\begin{bmatrix} \epsilon xn \\ \epsilon yn \end{bmatrix} = \begin{bmatrix} Fxn \\ Fyn \end{bmatrix} - \begin{bmatrix} Dxn \\ Dyn \end{bmatrix} \quad (3)$$

$$= \begin{bmatrix} Rx - 1, & -Rx(\omega + \theta) \\ Ry \cdot \theta, & Ry - 1 \end{bmatrix} \begin{bmatrix} Dxn \\ Dyn \end{bmatrix} + \begin{bmatrix} Ox \\ Oy \end{bmatrix}$$

Now, equation (2) may be rewritten into the following matrix operational equation:

$$Fn = A \cdot Dn + O \quad (4)$$

where $$Fn = \begin{pmatrix} Fxn \\ Fyn \end{pmatrix} \quad (5)$$

$$A = \begin{pmatrix} a_{11}, & a_{12} \\ a_{21}, & a_{22} \end{pmatrix} = \begin{pmatrix} Rx, & -Rx(\omega + \theta) \\ Ry \cdot \theta, & Ry \end{pmatrix} \quad (6)$$

$$Dn = \begin{pmatrix} Dxn \\ Dyn \end{pmatrix} \quad (7)$$

$$O = \begin{pmatrix} Ox \\ Oy \end{pmatrix} \tag{8}$$

So, two parameters A and O are determined so that the positional deviation for each shot position Fn, i.e., the address error En ($=\overline{Fn}-Fn$), is minimum when the actual shot position is measured by the detection of the marks and the actually measured value thereof is detected as $\overline{Fn}$. Therefore, assuming that the least squares error method is used as the evaluation function, the address error E is represented by equation (9) below.

$$\begin{aligned} E &= \sum_{n=1}^{m} (Exn)^2 + \sum_{n=1}^{m} (Eyn)^2 \\ &= \sum_{n=1}^{m} (\overline{Fxn} - Fxn)^2 + \sum_{n=1}^{m} (\overline{Fyn} - Fyn)^2 \end{aligned} \tag{9}$$

So, the parameters A and O are determined so that the address error E is minimum. In equation (9), m represents the number of the actually measured chips of the plurality of chips on the wafer. Assuming that the least squares method is used when the parameters A and O are to be found, the amount of operation is great in this state and therefore, the amount of offset O (Ox, Oy) is predetermined discretely. Since the amounts of offset (Ox, Oy) are the amount of global offset of the wafer, it may be a value obtained by averaging the address error relative to the design value (Dxn, Dyn) by the number m of the actually measured chip positions $\overline{Fn}$ on the wafer. That is, $$OX = \frac{\sum_{n=1}^{m} (Fxn - Dxn)}{m} \tag{10}$$

$$Oy = \frac{\sum_{n=1}^{m} (Fyn - Dyn)}{m} \tag{11}$$

Now, of the error En between the shot position Fn to be positioned and the actually measured value $\overline{Fn}$, the x direction component Exn is given as follows from equations (4)–(8):

$$Exn = \overline{Fxn} - Fxn = \overline{Fxn} - a_{11}Dxn - a_{12}Dyn - Ox \tag{12}$$

and the y direction component Eyn of the error En is likewise given as follows:

$$Eyn = \overline{Fyn} - Fyn = \overline{Fyn} - a_{21}Dxn - a_{22}Dyn - Oy \tag{13}$$

So, when the parameter A is determined so that the error E of equation (9) is minimum, the elements $a_{11}$, $a_{12}$, $a_{21}$ and $a_{22}$ are as follows:

$$a_{11} = \frac{\sum_{n=1}^{m} Dxn \cdot Dyn \sum_{n=1}^{m} Dyn \cdot (Ox - Fxn) - \sum_{n=1}^{m} Dyn^2 \sum_{n=1}^{m} Dxn(Ox - Fxn)}{\sum_{n=1}^{m} Dxn^2 \sum_{n=1}^{m} Dyn^2 - \left(\sum_{n=1}^{m} Dxn \cdot Dyn\right)^2} \tag{14}$$

$$a_{12} = \frac{\sum_{n=1}^{m} Dxn \cdot Dyn \sum_{n=1}^{m} Dxn \cdot (Ox - Fxn) - \sum_{n=1}^{m} Dxn^2 \sum_{n=1}^{m} Dyn(Ox - Fxn)}{\sum_{n=1}^{m} Dxn^2 \sum_{n=1}^{m} Dyn^2 - \left(\sum_{n=1}^{m} Dxn \cdot Dyn\right)^2} \tag{15}$$

$$a_{21} = \frac{\sum_{n=1}^{m} Dxn \cdot Dyn \sum_{n=1}^{m} Dyn \cdot (Oy - Fyn) - \sum_{n=1}^{m} Dyn^2 \sum_{n=1}^{m} Dxn(Oy - Fyn)}{\sum_{n=1}^{m} Dxn^2 \sum_{n=1}^{m} Dyn^2 - \left(\sum_{n=1}^{m} Dxn \cdot Dyn\right)^2} \tag{16}$$

$$a_{22} = \frac{\sum_{n=1}^{m} Dxn \cdot Dyn \sum_{n=1}^{m} Dxn \cdot (Oy - Fyn) - \sum_{n=1}^{m} Dxn^2 \sum_{n=1}^{m} Dyn(Oy - Fyn)}{\sum_{n=1}^{m} Dxn^2 \sum_{n=1}^{m} Dyn^2 - \left(\sum_{n=1}^{m} Dxn \cdot Dyn\right)^2} \tag{17}$$

If the elements $a_{11}$, $a_{12}$, $a_{21}$ and $a_{22}$ are found, the amounts of linear expansion and contraction Rx and Ry, the amount of residual rotation error $\theta$ and the amount of error of degree of orthogonality $\omega$ will be immediately found.

$$Rx = a_{11} \tag{18}$$

$$Ry = a_{22} \tag{19}$$

$$\theta = a_{21}/Ry = a_{21}/a_{22} \tag{20}$$

$$\begin{aligned} \omega &= -(a_{21}/Ry) - (a_{12}/Rx) \\ &= -(a_{21}/a_{22}) - (a_{12}/a_{11}) \end{aligned} \tag{21}$$

Accordingly, to determine the error parameters A and O, the positions of the marks SXn and SYn may be actually measured with respect to several, e.g. four or more of the chips on the wafer by the use of the X-LSA system and the Y-LSA system after the termination of the global alignment to thereby find the actually measured values $\overline{Fxn}$ and $\overline{Fyn}$ and at the same time, operation of equations (10), (11) and (14)–(17) may be effected by the use of the design values Dxn and Dyn of the actually measured chips.

Figure 3:
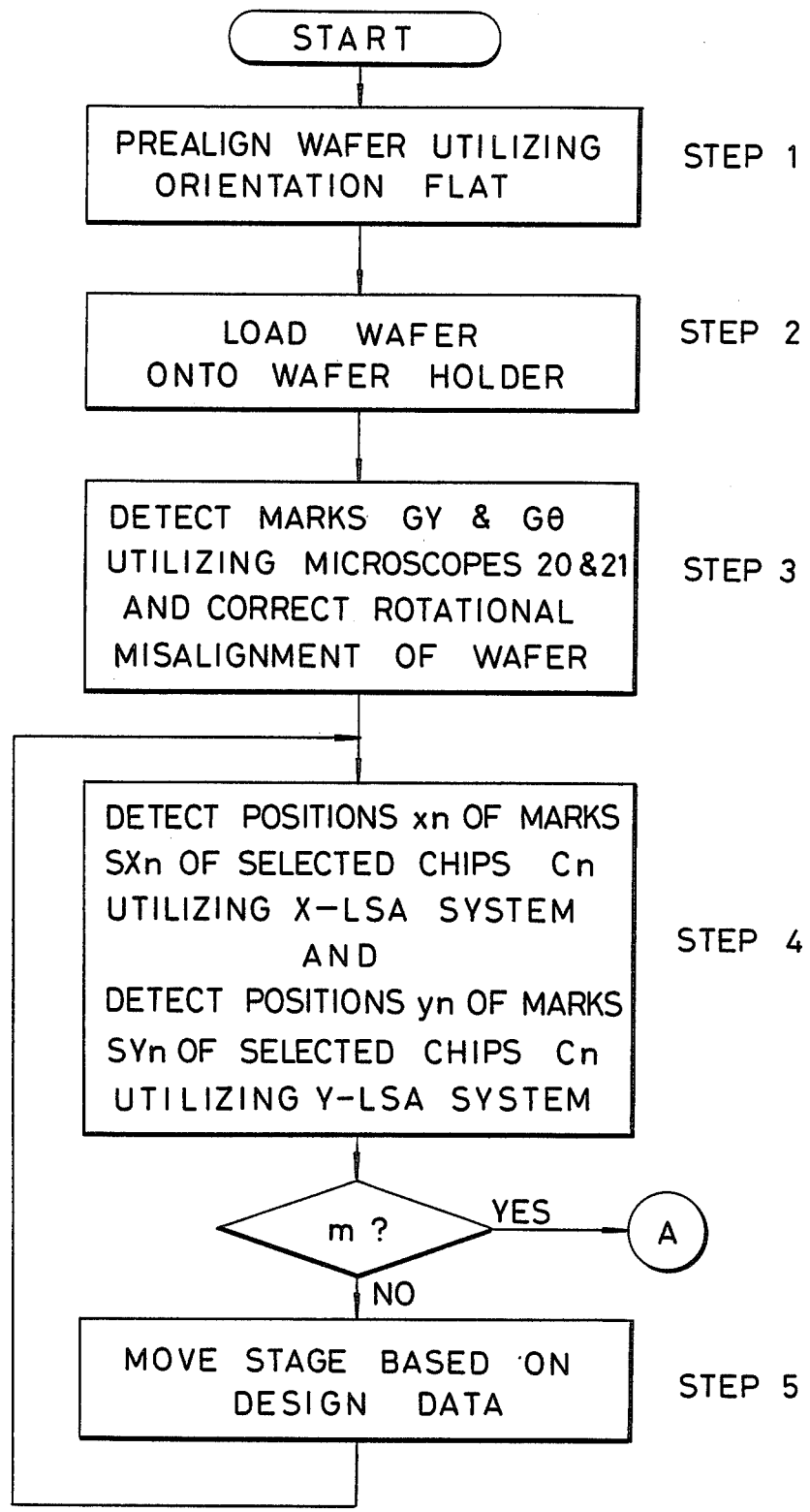
FIGS. 3 and 4 are flow charts showing the general operation procedure using the alignment method of the present invention.
Figure 4:
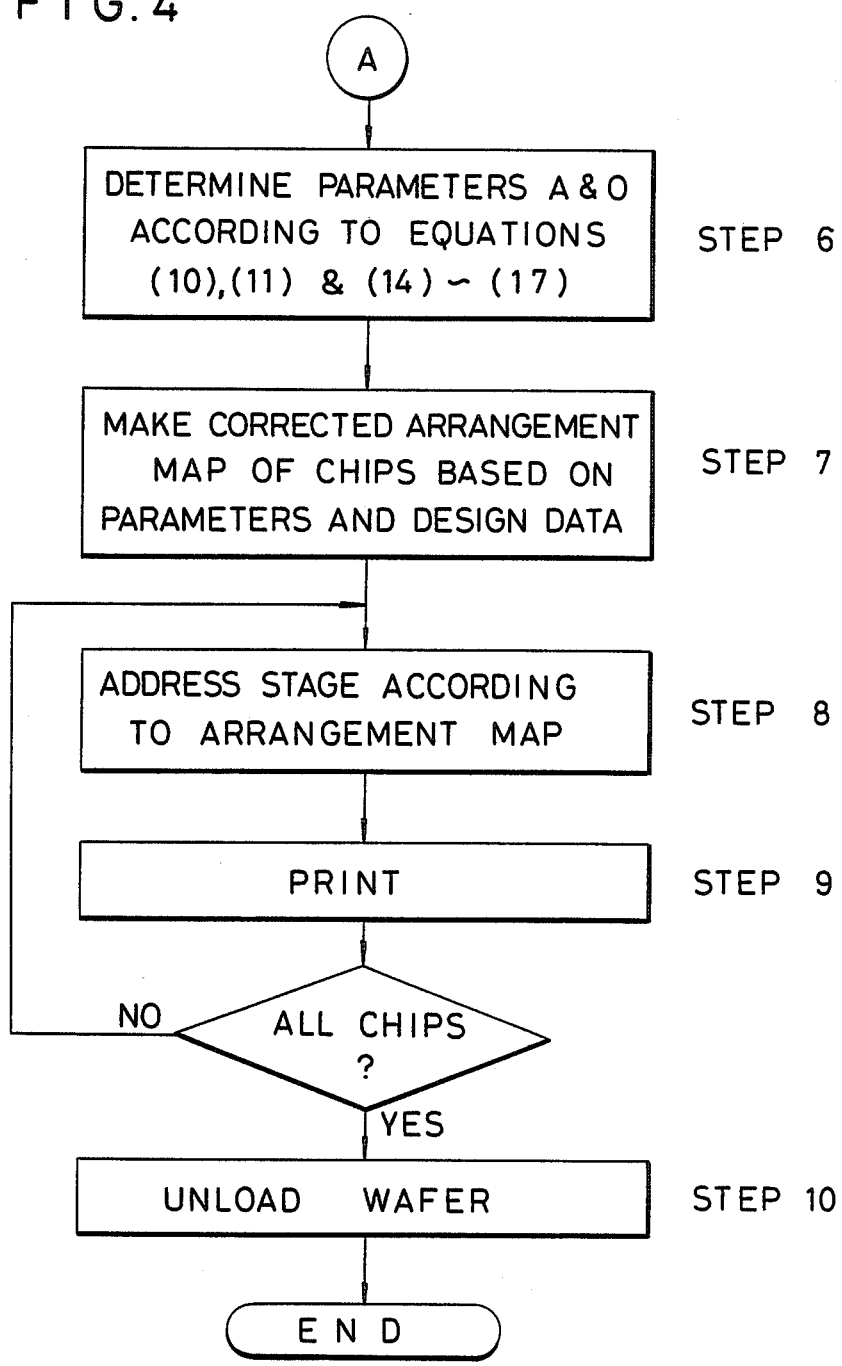

Turning back to the flow chart of FIG. 3, description of the operation will be continued. The main control device 50 measures the positions of the plurality of chips of the wafer after the global alignment has been terminated. First, at step 4, the main control device 50 positions the stage 3 on the basis of the arrangement design value so that the light spot LXS of the X-LSA system is arranged parallel to the mark $SX_0$ attendant to the leftmost chip $C_0$ in FIG. 5, whereafter it moves the stage 3 by a predetermined amount in x direction so that the mark $SX_0$ crosses the light spot LXS. During this movement, the main control device 50 stores therein the wave form of the time-serial photoelectric signal of the photoelectric element 48 correspondingly to the x direction position information from the laser interferometer 10, and detects from the state of the wave form the position $x_0$ at the point of time whereat the mark $SX_0$ and the light spot LXS have become coincident with each other with respect to x direction.

Figure 6:
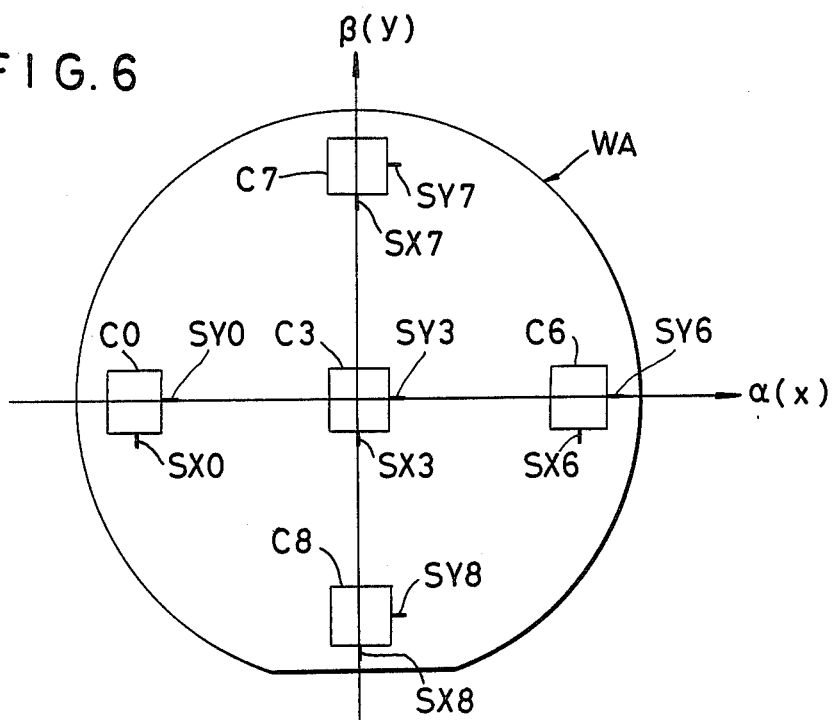
FIG. 6 is a plan view of a wafer showing the positions of chips in which step alignment is effected.

Subsequently, the main control device 50 positions the stage 3 on the basis of the arrangement design value so that the light spot LYS of the Y-LSA system is arranged parallel to the mark $SY_0$ attendant to the chip $C_0$. Thereafter, it moves the stage 3 by a predetermined amount in y direction so that the mark $SY_0$ crosses the light spot LYS. At this time, the main control device 50 stores therein the wave form of the time-serial photoelectric signal on the photoelectric element 38 correspondingly to the y direction position information from the laser interferometer 9 and defects from the state of the wave form the position $y_0$ at the point of time whereat the mark $SY_0$ and the light spot LYS have become coincident with each other with respect to y direction. Then, the main control device 50 judges whether similar position detection has been effected with respect to m chips and when the answer is "No", it proceeds to step 5 and moves the stage 3 to another chip on the wafer on the basis of the arrangement design value, and from step 4, it repeats a similar position detecting operation. In the present embodiment, it is to be understood that the position detection of step 4 is effected with respect to each of the four chips $C_0$, $C_6$, $C_7$ and $C_8$ positioned substantially equidistantly from the center of the wafer WA along each axis of the arrangement coordinates $\alpha\beta$ as shown in FIG. 6 and the middle chip $C_3$, thus a total of five chips. Accordingly, at the point of time whereat $m=5$ is judged, five actually measured values $(\overline{Fxn}, \overline{Fyn})$ are stored in the main control device 50. That is, the following five actually measured values corresponding to the chips $C_0$, $C_3$, $C_6$, $C_7$ and $C_8$, respectively, are successively detected:

$(\overline{Fx_1}, \overline{Fy_1}) = (x_0, y_0)$
$(\overline{Fx_2}, \overline{Fy_2}) = (x_3, y_3)$
$(\overline{Fx_3}, \overline{Fy_3}) = (x_6, y_6)$
$(\overline{Fx_4}, \overline{Fy_4}) = (x_7, Y_7)$
$(\overline{Fx_5}, \overline{Fy_5}) = (x_8, y_8)$ When these five actually measured values are to be detected, if the actually measured value of a certain chip differs greatly from the deisgn value (Dxn, Dyn) of that chip, for example, if it differs by two times or more the positioning accuracy determined by the global alignment, then the actually measured value of that chip may be neglected and the actual measurement of the mark position may be effected with respect, for example, to a chip adjacent thereto. This is for making up for the deterioration of the accuracy of position measurement which may occur when the mark of the chip to be actually measured happens to be deformed by the working process, or when dust adheres to that mark, or when the contrast of the optical image of that mark (the occurrence intensity of diffracted light) is weak and the S/N ratio of the photoelectric signal is low. As the method of making up for the deterioration of the accuracy of position measurement, there is a method in which position measurement is effected in advance with respect to six or more chips, for example, a total of nine chips including the chips positioned in the respective ones of four quadrants of the arrangement coordinates $\alpha\beta$ in FIG. 6, and from among the nine actually measured values, five actually measured values are chosen in the order most approximate to the design value (Dxn, Dyn) of each chip, or a method in which the actually measured value $(\overline{Fxn}, \overline{Fyn})$ greatly differing from the design value (Dxn, Dyn) is not used in the subsequent operation process.

Subsequently, at step 6 of FIG. 4, the main control device 50 determines the parameters A and O on the basis of equations (10), (11) and (14)–(17). In determining these parameters, the main control device 50 prechooses the five design values of said five chips and stores therein those design values (Dxn, Dyn) as follows:

$(Dx_1, Dy_1) = (x_0', y_0')$
$(Dx_2, Dy_2) = (x_3', y_3')$
$(Dx_3, Dy_3) = (x_6', y_6')$
$(Dx_4, Dy_4) = (x_7', y_7')$
$(Dx_5, Dy_5) = (x_8', y_8')$

Also, prior to the actual determination of the parameters A and O, each time the position measurement (the so-called step alignment) of the five chips is terminated, for example, during the time that the stage 3 is moved at step 5, operation of a part of equations (10), (11) and (14)–(17) can be executed at the same time. That is, in equations (10), (11) and (14)–(17), as regards the operational elements representative of the algebraic sums of the data (the actually measured value and the design value) of the respective chips, they are added in succession each time the actual measurement (step alignment) of a chip is terminated. The operational elements are as follows:

$$\sum_{n=1}^{m} Dxn, \sum_{n=1}^{m} Dyn, \sum_{n=1}^{m} Fxn, \sum_{n=1}^{m} Fyn,$$

$$\sum_{n=1}^{m} Dxn^2, \sum_{n=1}^{m} Dyn^2, \sum_{n=1}^{m} Dxn \cdot Dyn,$$

$$\sum_{n=1}^{m} Dxn \cdot Fxn, \sum_{n=1}^{m} Dxn \cdot Fyn,$$

$$\sum_{n=1}^{m} Dyn \cdot Fxn, \sum_{n=1}^{m} Dyn \cdot Fyn \text{ (in the present}$$

embodiment, $m = 5$)

Further, of these operational elements, the operational element including only the design value (Dxn, Dyn) can be calculated before the execution of steps 4 and 5 if the chips on the wafer to be actually measured are predetermined and are not changed. If operation of a part is so effected in conjunction with the measuring operation of the actually measured values, the overall alignment time will not be so long. At the stage whereat the five actually measured values have been obtained, the main control device 50 calculates the amounts of offset (Ox, Oy) in equations (10) and (11) by using the result of said operational elements, whereafter it further calculates the elements $a_{11}$, $a_{12}$, $a_{21}$ and $a_{22}$ of the arrangement in equations (14)–(17) by using the value of offset and the result of said operational elements. By the above-described operations, the parameters A and O are determined and therefore, at the next step 7, the main control device 50 calculates the position to be positioned with respect to each chip of the wafer, i.e., the shot address (Fxn, Fxy) corrected by the parameters, in accordance with equation (4), and prepares on a semiconductor memory an arrangement map (shot address table) in which the chips are corrected relative to the design value (Dxn, Dyn). This arrangement map stores therein each position data corresponding to the numbers of the chips, in such a manner that, for example, the position $(Fx_0, Fy_0)$ corresponds to the chip $C_0$, the position $(Fx_1, Fy_1)$ corresponds to the chip $C_1$, and so on.

Subsequently, at step 8, the main control device 50 positions (addresses) the stage 3 in accordance with the stored arrangement map so that one of the chips on the wafer and the projected image Pr of the reticle accurately overlap each other. At step 9, the projected image Pr is printed on that chip. When it has been judged that the printing of all chips on the wafer has been terminated, the wafer is unloaded at the next step 10 and the exposure processing of a wafer is all completed.

As is apparent from the above-described embodiment of the present invention, as the number of chips to be step-aligned on the wafer is greater, the measurement accuracy is further improved, but correspondingly the measurement time increases. Therefore, from the balance of the reduction in the measurement time and the improvement of the measurement accuracy, the chips to be step-aligned should desirably be chosen to be the five chips disposed as shown in FIG. 6. However, where the minimum line width of the circuit patterns to be superposedly exposed is not so small (e.g., 2–5 μm) and it is not necessary to enhance the measurement accuracy very much, it will suffice to measure the positions of three spaced apart chips (e.g., $C_0$, $C_6$ and $C_7$) on the wafer and the measurement time will be reduced more.

Also, as a more efficient method of position measurement of chips by step alignment, the marks SXn attendant to a plurality of chips to be step-aligned may be scanned by the light spot LXS of the X-LSA system to thereby detect only the position of each chip in x direction, whereafer the marks SYn of the respective chips may be scanned by the light spot LYS of the Y-LSA system to thereby detect the position of each chip in y direction.

Also, if the data for choosing the chips to be step-aligned is input from a keyboard device, not shown, to the main control device 50, the state of the marks varied by the wafer processing conditions can be coped with more flexibly and improvement of the accuracy of position measurement can be expected. In determining the amounts of offset (Ox, Oy) by the use of equations (10) and (11), use may be made of only the result of the position measurement of the chips within a designated range, for example, from the center of the wafer. The designated range may for example be determined within a circle having one half of the diameter of the wafer, or the size of that range may be arbitrarily chosen in conformity with the accuracy characteristic of the exposure apparatus (the stepper of the reduction projection type, the one-to-one magnification projection type, the proximity type or the like) when chips and marks are formed on the wafer.

In the present embodiment, equation (4) is applied to all the chips on the wafer and the step-and-repeat type addressing is effected, but equation (4) can be likewise applied in the so-called block alignment in which the surface of the wafer is divided into several blocks and optimum alignment is effected for each individual block. For example, in FIG. 6, step alignment is effected with respect to the four chips positioned in the quadrants of the arrangement coordinates $\alpha\beta$ and five shown chips $C_0$, $C_3$, $C_6$, $C_7$ and $C_8$, a total of nine chips, to thereby detect the actually measured value of the position of each chip, whereafter the error parameters A and O are determined by the use of equations (10), (11) and (14)–(17) for each quadrant of the arrangement coordinates $\alpha\beta$ and further, the position (Fxn, Fyn) is calculated by the use of equation (4). For example, with regard to the block of the first quadrant of the arrangement coordinates $\alpha\beta$, equation (4) is determined by the use of the actually measured values of four chips, i.e., a chip within the first quadrant and chips $C_3$, $C_6$ and $C_7$, and with regard to the block in the second quadrant, equation (4) is determined by the use of the actually measured values of four chips, i.e., a chip within the second quadrant and chips $C_0$, $C_3$ and $C_7$. During the actual exposure, the chips on the wafer are aligned with the projected image Pr on the basis of the shot position (Fxn, Fyn) from equation (4) determined for each block. If this is done, the fault of the position detection and alignment by the non-linear element on the wafer will be reduced and unlike the conventional block alignment, the wafer can be divided into blocks while the averaging element remains left, and this leads to an advantage that the superposition accuracy in each block is substantially average for any chip. In addition, a great advantage can also be obtained when the present method is used with exposure apparatus other than a stepper, particularly with a mirror projection exposure apparatus. Generally, the chip arrangement of a wafer printed by the mirror projection exposure apparatus is often curved. Therefore, where superposition exposure is to be effected on the wafer by the stepper, if the block alignment as described above is effected, the curvature of the chip arrangement in each block will be negligibly small and therefore, printing of very high superposition accuracy will become possible over the entire surface of the wafer.

The aligning method of the present invention is also applicable to an exposure apparatus using an alignment system in which a light spot is singly vibrated or rectilinearly scanned at a uniform speed on a wafer or a so-called die-by-die alignment optical system in which the mark on a reticle and the mark on a wafer are observed through a microscope objective lens disposed above the reticle to thereby accomplish alignment. In this case, assuming that during the die-by-die alignment, the reticle is not finely moved in x and y directions, the projected image of the mark on the reticle corresponds to the light spots LXS and LYS in the present embodiment. Also, in a system of the type in which the reticle is finely moved, the reticle is first set accurately at the origin position. Then, during the step alignment of a plurality of chips, the stage is caused to effect stepping in accordance with the arrangement design value, whereafter the reticle is finely moved so that the mark of the reticle and the mark of the chip to be actually measured may assume a predetermined positional relation, and the amounts of movement of the reticle in x and y directions from the origin are detected, whereby the actually measured value $(\overline{Fxn}, \overline{Fyn})$ of the position of that chip can be calculated.

In the present embodiment, the simplification of the operation process is contrived by finding the amounts of offset (Ox, Oy) discretely and singly, but the error parameters A and O which will minimize the address error E of equation (9) may be calculated by a strict operation process.

In the embodiment described above, the parameter A which contains the rotation $\theta$ of the wafer, the degree of orthogonality $\omega$ and the linear expansion and contraction Rx, Ry, and the parameter O which contains the offsets Ox, Oy are treated as error parameters. However, in the following embodiment, the above four error factors will be respectively treated as an error parameter.

Considering the actual wafer process, the wafers in the same lot are under extremely similar influence due to the preceding steps because usually about 25 wafers in every lot should undergo the same step. As a matter of course, a difference among wafers is very small if they are successively processed even though they are in different lots. Therefore, out of the four error parameters, the amounts of the scaling (linear expansion and contraction) and the degree of orthogonality are considered almost the same in every wafer under the successive processing. An error parameter in the alignment system should be also predetermined if a drift is ignored. However, the wafers are mounted on the stage one by one and, after the alignment is made by rotating the $\theta$ table on the stage with the wafer alignment microscope ($\theta$ alignment) so that X direction on the stage is parallel with the $\beta$ axis in the shot arrangement on the wafer, the stage is fixed on the $\theta$ table by means of vacuum adsorption or the like. Accordingly, whenever the wafer is fixed on the stage, the origin on the wafer slightly deviates in respect to the reference point in the alignment system (wafer alignment microscope or LSA system). Therefore the offset among the error parameters is a factor which is variable for each wafer.

Also in the $\theta$ alignment, the error amount possibly varies for each wafer. Accordingly, the rotation is another factor which is variable for each wafer.

In the second embodiment, the process AP for detecting the offset and the rotation is applied to all of a plurality of wafers to be successively processed, and the process BP for detecting the scaling and the degree of orthogonality is further applied to a few wafers following the start of the processing. The wafers to which the process BP should not be applied are processed by using results of the measurement of the scaling and the degree of orthogonality for the other wafers to which the process BP should be applied.

The following conditions are set forth for the embodiment:

The number of wafers which carry out the process AP (the number of all wafers) ... N
The number of wafers which carry out the process BP ... m (where m<N)
The number of shots per wafer for carrying out the process AP ... a
The number of shots per wafer for carying out the process BP ... b
The shot numbers for carrying out the process AP ... $A_1$ to $A_a$
The shot numbers for carrying out the process BP ... $B_1$ to $B_b$ The operation of the embodiment will be described below, in which the number of shots a is 3 and the number of shots b is 7.

Figure 9:
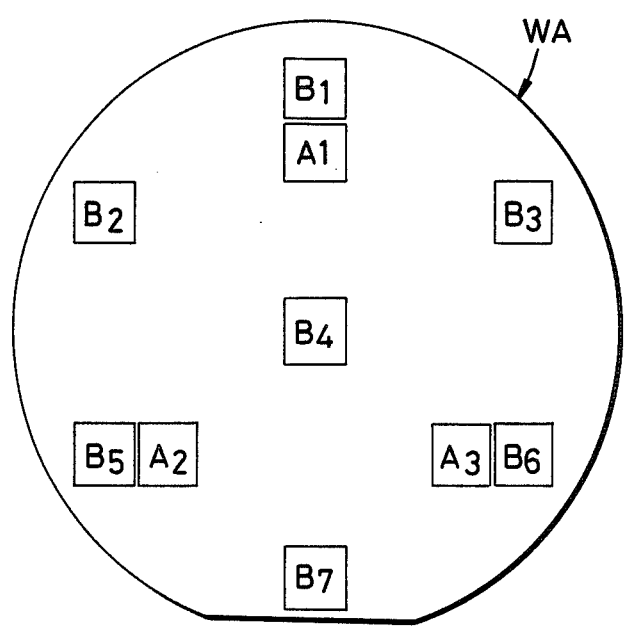
FIG. 9 is a plan view showing the arrangement of shots which are designated for the sample alignment on the wafer.

The positions of shots corresponding to the shot numbers $A_1$, $A_2$, $A_3$, $B_1$, $B_2$, $B_3$, $B_4$, $B_5$, $B_6$ and $B_7$ on the wafer WA are determined as shown in FIG. 9. The shots $A_1$ to $A_3$ are determined at three positions which have almost the same distance from and make almost the same angle in respect to the center of the wafer. Out of the shots $B_1$ to $B_7$, the shot $B_4$ is positioned around the center of the wafer and the shots $B_1$, $B_2$, $B_3$, $B_5$, $B_6$ and $B_7$ are determined at six positions which have almost the same distance from and make almost the same angle in respect to the shot $B_4$. In this embodiment, the shots $A_1$ to $A_3$ and the shots $B_1$ to $B_7$ do not superpose upon each other.

Figure 7:
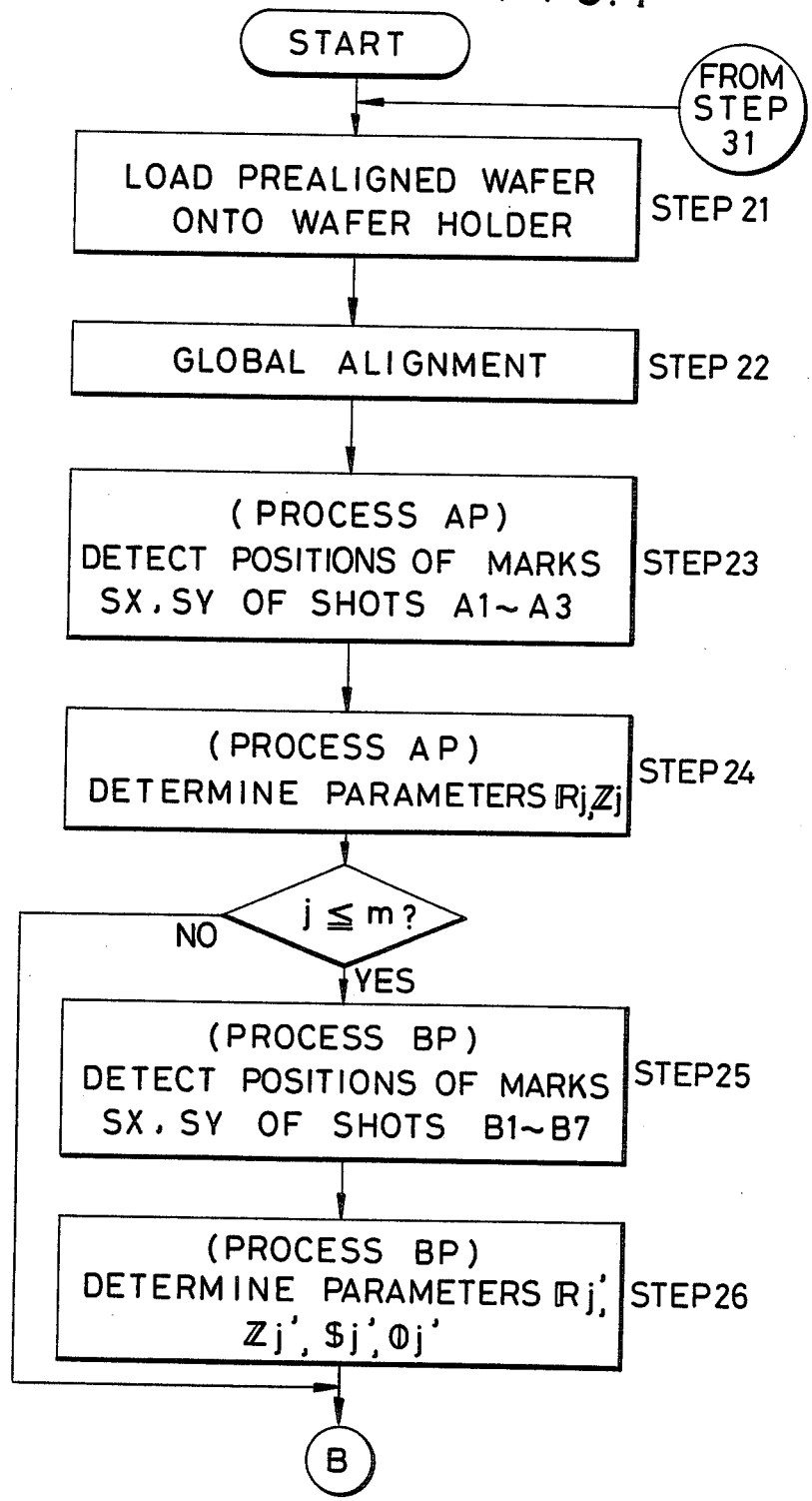
FIGS. 7 and 8 are flow charts showing the operation of the alignment method according to another embodiment of the present invention.

In the following, the steps in FIGS. 7 and 8 will be explained in order.

First one out of N pieces of wafers to be successively processed is pre-aligned in the same way as the step 1 in the above-described embodiment. Then it is mounted on the wafer holder for the vacuum adsorption. (Step 21)

Next, like the step 3 described before, a global alignment is executed (Step 22). In this step both origins of the arrangement coordinates $\alpha\beta$ on the wafer and of the movement coordinates system xy of the stage are made correspondent with deviation, for instance, less than 1 $\mu$m.

In the next step 23, the positions of the marks SX, SY respectively attached to the shots $A_1$ to $A_3$ (where a=3) are detected by using the X-LSA system and the Y-LSA system and by running the stage 3 as the process AP.

Thereby, the sample alignment for the shots $A_1$, $A_2$ and $A_3$ is completed.

In this embodiment, according to equation (12) used in the above-described embodiment, the square sum $\Sigma Exn^2$ is represented as shown in equation (22) below, where the number of shots for executing the sample alignment is k.

$$\sum_{n=1}^{k} Exn^2 = \sum_{n=1}^{k} (Fxn - a_{11} \cdot Dxn - a_{12} \cdot Dyn - Ox)^2 \quad (22)$$

In order to obtain $a_{11}$, $a_{12}$ and Ox which make this equation (22) minimum, equation (22) is partially differentiated by the unknown quantities $a_{11}$, $a_{13}$ and Ox respectively, thereby giving zero to respective equations. The three equations thus obtained may be rewritten into the following matrix equation:

$$\begin{bmatrix} \Sigma Dxn^2 & \Sigma Dxn \cdot Dyn & \Sigma Dxn \\ \Sigma Dxn \cdot Dyn & \Sigma Dyn^2 & \Sigma Dyn \\ \Sigma Dxn & \Sigma Dyn & \Sigma 1 \end{bmatrix} \begin{bmatrix} a_{11} \\ a_{12} \\ Ox \end{bmatrix} = \begin{bmatrix} \Sigma Fxn \cdot Dxn \\ \Sigma Fxn \cdot Dyn \\ \Sigma Fxn \end{bmatrix} \quad (23)$$

and the y component in equation (13) is likewise given as follow:

$$\begin{bmatrix} \Sigma Dxn^2 & \Sigma Dxn \cdot Dyn & \Sigma Dxn \\ \Sigma Dxn \cdot Dyn & \Sigma Dyn^2 & \Sigma Dyn \\ \Sigma Dxn & \Sigma Dyn & \Sigma 1 \end{bmatrix} \begin{bmatrix} a_{21} \\ a_{22} \\ Oy \end{bmatrix} = \begin{bmatrix} \Sigma Fxn \cdot Dxn \\ \Sigma Fxn \cdot Dyn \\ \Sigma Fxn \end{bmatrix} \quad (24)$$

Accordingly, if $\Sigma Dxn$, $\Sigma Dyn$, $\Sigma Dxn^2$, $\Sigma Dyn^2$, $\Sigma Dxn.Dyn$, $\overline{\Sigma Fxn}.Dxn$, $\overline{\Sigma Fxn}.Dyn$, $\overline{\Sigma Fxn}$, $\Sigma Fyn.Dxn$, $\Sigma Fyn.Dyn$, $\Sigma Fyn$ and the like are respectively added whenever the sample alignment for one shot is completed and equations (23) and (24) are solved when the sample alignment for the k-th shot is completed, all of the unknown quantities $a_{11}(=Rx)$, $a_{12}(=-Rx(\omega+\theta))$, Ox, $a_{21}(=Ry.\theta)$, $a_{22}(=Ry)$ and Oy will be found.

When the positions of the shot $A_1$, $A_2$, $A_3$ on the wafer are determined beforehand, the values $\Sigma Dxn^2$, $\Sigma Dyn^2$, $\Sigma Dxn.Dyn$, $\Sigma Dxn$ and $\Sigma Dyn$ in the left side of equations (23) and (24) can be calculated beforehand on the basis of the design values.

Therefore, the values $\overline{Fxn.Dxn}$, $\overline{Fxn.Dyn}$, $\overline{Fxn}$, $\overline{Fyn.Dxn}$, $\overline{Fyn.Dyn}$ and $\overline{Fyn}$ in the right side of equations (23) and (24) may be found and respectively added whenever the sample alignment for the shots $A_1$ to $A_3$ is executed.

In the step 24, by solving equations (23) and (24), the six unknown quantities are found and the rotation $\mathbb{R}j$ and the offset $\mathbb{Z}j$ in the wafer under processing are obtained. Here, the suffix j represents the number of wafers to be processed. The rotation $\mathbb{R}j$ is $a_{21}/a_{22}$ while the offset $\mathbb{Z}j$ is (Ox, Oy).

Next whether such wafer requires the process BP or not is judged. That is, whether or not the wafer currently under processing is the m-th one which is predetermined as a final one for the processing is judged. If $j \leq m$, the processing advances to the next step 25 for execution of the process BP and if $j > m$, it advances to the next judgement.

In the step 25, the positions of the marks SX, SY respectively attached to the shots $B_1$ to $B_7$ (where b=7) are detected by using the LSA system and running the stage 3 as the process BP.

Then on the basis of the measured values for the shots $B_1$ to $B_7$, the six unknown quantities are calculated by using equations (23) and (24) in the same way as the step 24. Then all of the four parameters, that is, the rotation $\mathbb{R}j'$, the offset $\mathbb{Z}j'$, the scaling $\$j'$ (i.e., Rx, Ry) and the degree of orthogonality $\mathbb{O}j'$ (i.e., $-a_{12}/a_{11}-a_{21}/a_{22}$) will be found. (Step 26)

Next, whether or not the number of processed wafers attains the m-th is judged and only when j=m, the step 27 will be executed.

When the number of processed wafers attains m, the main control device 50 stores the parameters determined in the process AP and the process BP for every wafer from the first to the m-th as shown in the following table.

calculated in accordance with the folowing equations (25), (26), (27) and (28):

$$R = \frac{1}{m} \sum_{j=1}^{m} j' - \frac{1}{m} \sum_{j=1}^{m} i \quad (25)$$

$$Z = \frac{1}{m} \sum_{j=1}^{m} j' - \frac{1}{m} \sum_{j=1}^{m} j \quad (26)$$

$$S = \frac{1}{m} \sum_{j=1}^{m} j' \quad (27)$$

$$O = \frac{1}{m} \sum_{j=1}^{m} j' \quad (28)$$

Next whether or not the number of processed wafers j is greater than m is judged and if j is greater than m, the processing will advance to the step 29. For the first to the m-th wafer, the step 28 will be executed. In other words, as shown in the above mentioned table, the parameters $\mathbb{R}j'$, $\mathbb{Z}j'$, $\$j'$ and $j'$ and used for determination of the shot positions for actual exposure.

Then by using the aforementioned equation (1) or (2), the coordinates positions (Fxn, Fyn) of each shot on the wafer are determined on the basis of the design values (Dxn, Dyn) in order to prepare the shot address map.

For the (m+1)th to the N-th wafer, the step 29 will be executed. In other words, the shot positions are determined by using the parameters $\not{R}+R$, $\mathbb{Z}j+z$, S and O in order to prepare the shot address map.

For the wafers on and after the (m+1)th one, the values R, Z for the wafer up to the m-th will be added with respect to the rotation and the offset. This is to obtain higher accuracy by giving weight to the parameters $\mathbb{R}j'$ and $\mathbb{Z}j'$ which are determined by the measurements with a lot of shots for the sample alignment like the process BP.

In accordance with the shot address map thus prepared, the wafers are successively aligned to be exposed repeatedly, thereby effecting the step-and-repeat type exposure for one wafer. (Step 30)

Upon completion of the exposure processing of one wafer, whether or not the wafer is the N-th one is judged. If it is the N-th one, all of the exposure process-

TABLE

| j | PARAMETERS DETERMINED IN PROCESS AP | | PROCESS BP | | | | PARAMETERS IN EXPOSURES | | | |
|---|---|---|---|---|---|---|---|---|---|---|
| 1 | $R_1$ | $Z_1$ | $S_1'$ | $O_1'$ | $R_1'$ | $Z_1'$ | $S_1'$ | $O_1'$ | $R_1'$ | $Z_1'$ |
| 2 | $R_2$ | $Z_2$ | $S_2'$ | $O_2'$ | $R_2'$ | $Z_2'$ | $S_2'$ | $O_2'$ | $R_2'$ | $Z_2'$ |
| 3 | $R_3$ | $Z_3$ | $S_3'$ | $O_3'$ | $R_3'$ | $Z_3'$ | $S_3'$ | $O_3'$ | $R_3'$ | $Z_3'$ |
| . | . | . | . | . | . | . | . | . | . | . |
| m−1 | $R_{m-1}$ | $Z_{m-1}$ | $S_{m-1}'$ | $O_{m-1}'$ | $R_{m-1}'$ | $Z_{m-1}'$ | $S_{m-1}'$ | $O_{m-1}'$ | $R_{m-1}'$ | $Z_{m-1}'$ |
| m | $R_m$ | $Z_m$ | $S_m'$ | $O_m'$ | $R_m'$ | $Z_m'$ | $S_m'$ | $O_m'$ | $R_m'$ | $Z_m'$ |
| m+1 | $R_{m+1}$ | $Z_{m+1}$ | | | — | | S | O | $R_{m+1+R}$ | $Z_{m+1+Z}$ |
| m+2 | $R_{m+2}$ | $Z_{m+2}$ | | | — | | S | O | $R_{m+2+R}$ | $Z_{m+2+Z}$ |
| . | . | . | | | | | . | . | . | . |
| N−1 | $R_{N-1}$ | $Z_{N-1}$ | | | — | | S | O | $R_{N-1+R}$ | $Z_{N-1+Z}$ |
| N | $R_N$ | $Z_N$ | | | — | | S | O | $R_{N+R}$ | $Z_{N+Z}$ |

In the step 27, in order to apply the values for the scaling and the degree of orthogonality for up to the m-th wafer determined in the process BP to the processing for the (m+1)th one and after, the average parameter of respective parameter values from the first to the m-th wafer, that is, the rotation R, the offsets Z, the scaling S and the degree of orthogonality O will be ing proves to be completed. Otherwise, the wafer advances to the next step 31.

Here the wafer is unloaded from (carried out of) the stage 3 and the variable j for the number of the wafers to be processed is incremented (+1) to effect the same operation starting the step 21 repeatedly.

Figure 8:
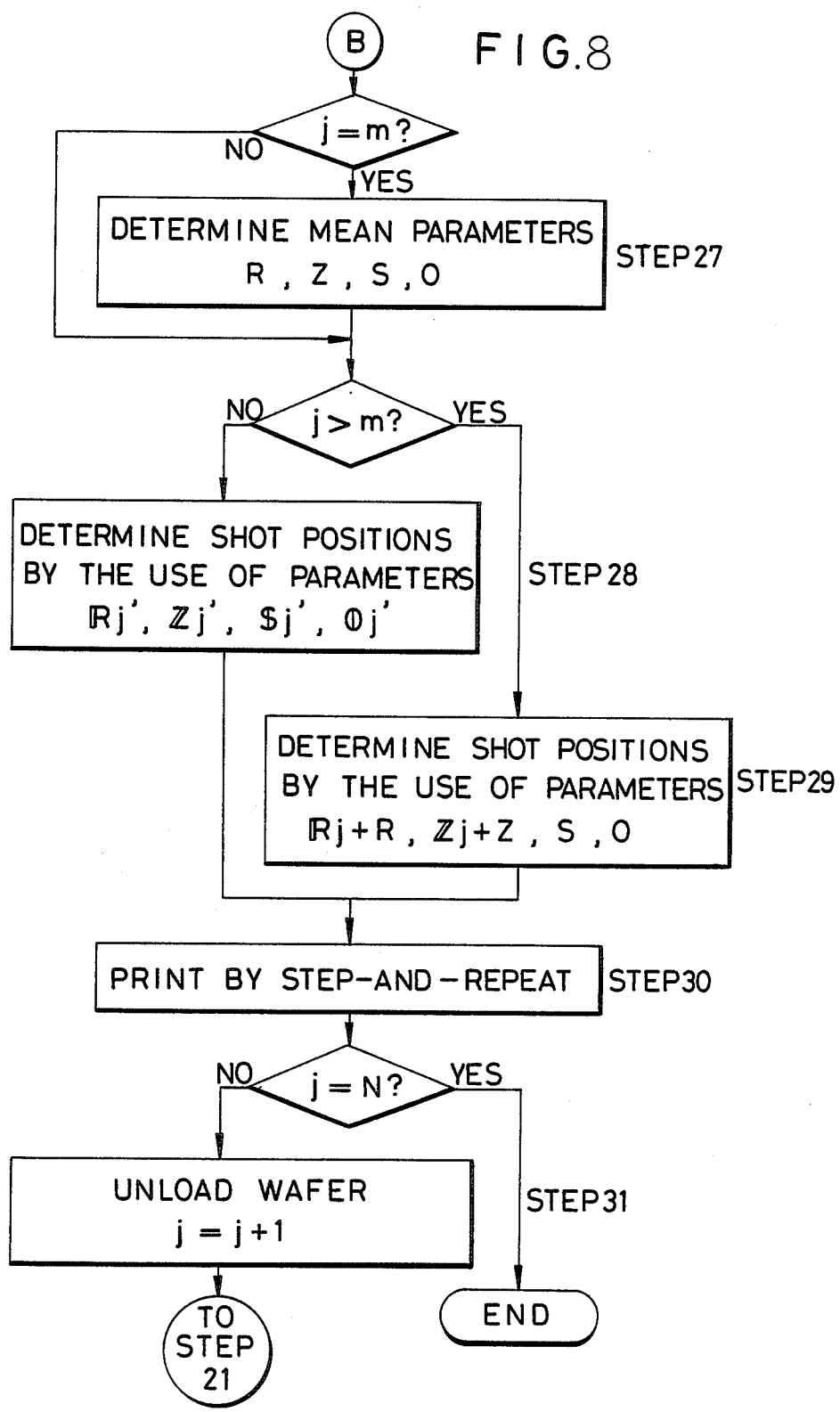

In the present embodiment though each step shown in FIG. 8 is explained by clearly distinguishing the process AP and the process BP, it is more effective to successively effect the step 23 and the step 25 so as to obtain actually measured values of each position of the shots $A_1$ to Aa and $B_1$ to Bb in order since it is predetermined that the process BP is effected for the first to the m-th wafer beforehand.

Furthermore, the shots $A_1$ to $A_6$ and the shots $B_1$ to $B_6$ of the sample alignment are determined not to be overlapped each other. However, such determination is not always necessary. The same effect can be obtained when all or a part of the shots $A_1$ to $A_6$ are determined to be superposed upon the shots $B_1$ to Bb.

In determination of the parameters for the process AP and the process BP, it is sufficient if at least the parameter with a value variable with the substrate (in this embodiment, the rotation and the offset) will be found in the process AP and the other parameters (in this embodiment, the scaling and the degree of orthogonality) in the process BP. Accordingly, it is possibly considered, for instance, to use the added and averaged differences between the measured values and the design values for the offset to make the calculation simple.

Furthermore, if the central position of the wafer and the rotation can be measured by global alignment in the step 22, the step 23 can be omitted by use of such values.

In each of the above-described embodiments, a stepper is given for example which has the function to effect an alignment with high accuracy, such as the LSA system, automatically at high speed. However, the same effect can be obtained with a device having no function such as the LSA system. For instance, the device shown in FIG. 10 comprises, the ITV 122 which projects the image RM' of the mark RM provided in the reticle R and the image WM' of the mark WM incidental to the shot area on the wafer W on the CRT 123 through the projection lens 101, the mirror 120 and the extended optical system 121, and the controller 111 which slightly moves the stage 103 by driving the motor 110 according to the operation of the joy stick 124 to make the predetermined positional relation between the images RM' and WM' displayed on the CRT 123, wherein one shot area to be exposed is aligned with the pattern image of the reticle by means of the manual alignment. When using such device, just the global alignment is effected for the wafer mounted on the stage 103 by use of the wafer alignment microscope 130. A plurality of such wafer alignment microscopes 130 are provided as shown by the detection fields 130θ, 130Y in FIG. 11 and the optic axis $AX_2$ which is the center of such detection is fixed as mechanically keeping the predetermined distance away from the optic axis $AX_1$, of the projection lens 101. The the marks GMy, GMθ, GMx are formed beforehand for the global alignment as shown in FIG. 11 with respect to all of the wafers to be exposed. Here the marks GMy and GMθ are provided on a line in parallel with the β-axis of the arrangement coordinates αβ with a predetermined interval between them and the marks GMy and GMθ are respectively used for the alignment in y direction (α direction) and the mark GMx is used for the alignment in X direction (β direction).

When using the stepper in the above-mentioned construction, for example, with respect to the wafers from the first to the m-th of the lot, first the marks GMy, GMθ, GMx are detected by a plurality of the wafer alignment microscopes 30 and then the global alignment is executed to make the arrangement coordinates system αβ correspond to the movement coordinates system xy of the stage 103. After that, the manual sample alignment by use of the mark RM and the mark WM is executed for a plurality of shot areas on the wafer so that the coordinate positions of the stage at the time when correct alignment is attained for each shot area are successively stored as the actually measured values.

On the basis of these measured values and the design values, the above-mentioned plurality (four) of parameters are respectively found and the step-and-repeat type exposure is executed according to the regularity of the actual shot arrangement which is determined by such parameters.

Furthermore, for the wafers from the (m+1)th to the N-th, the wafer central value (the position of the origin of the coordinates system αβ as being in the coordinates system xy) found for the global alignment is treated as the offset and the alignment for each wafer from the (m+1)th or after can be omitted by use of the wafer rotation found by the wafer alignment microscope 30 after the θ alignment.

In other words, in this embodiment, the sample alignment such as the process AP in the preceding embodiment is not effected and for the parameters variable for each wafer, the positional deviation as a whole of a plurality of pattern areas detected due to the global alignment is calculated as the actually measured values. To the scaling and the degree of orthogonality for each wafer on and after the (m+1)th one, as a matter of fact, the values obtained for the first to the m-th wafer are applied. For this reason, with respect to each wafer from the (m+1)th or after, the exposing processing for them including the loading and the unloading operations can be omitted for each shot.

We claim:

1. A method for successive alignment of each of a plurality of chip patterns regularly arranged on a substrate in accordance with predetermined coordinates to a reference position, comprising the steps of:

(a) moving said substrate so as to successively make selected several of said plurality of chip patterns correspond to said reference position in accordance with design data representative of the coordinates position of each of said plurality of chip patterns;

(b) measuring the positions of said selected several chip patterns when made to correspond to said reference position;

(c) determining, on the basis of the measured positions, coefficients of an operational equation so that the sum of the square of deviations between positions of said selected chip patterns determined by use of the operational equation and positions of said selected chip patterns represented by said design data may be minimum;

(d) determining positions corresponding to said plurality of chip patterns on the basis of said operational equation; and (e) moving said substrate in accordance with said determined positions.

2. A method for successive alignment of each of a plurality of chip patterns regularly arranged on a substrate to a reference position, each of said plurality of chip patterns having reference mark means provided in a determined positional relationship with the corresponding chip pattern, said method comprising the steps of:

(a) measuring deviations between positions of said plurality of chip patterns and design data representing positions of said plurality of chip patterns, respectively, by use of said reference mark means;

(b) detecting a chip pattern that has no mark means within a predetermined range from the position represented by said design data;

(c) determining, on the basis of said deviations corresponding to chip patterns of said plurality excepting the detected chip pattern, positions corresponding to said plurality of chip patterns including said detected chip pattern; and (d) moving said substrate in accordance with the determined positions.

3. A method according to claim 1, wherein said coefficients include a first parameter dependent upon the rotation error of said substrate relative to said predetermined coordinates, the movement error of said substrate relative to a reference direction and the linear expansion and contraction of said substrate, and a second parameter dependent upon the offset of said substrate relative to said reference position.

4. With respect to a plurality of substrates which are respectively provided for a plurality of chip patterns formed in a regular arrangement in accordance with design data, a method for successive alignment of each of said chip patterns to a reference position, comprising the steps of:

(a) with respect to each of the first to the m-th of said substrates, measuring actual positions of several chip patterns selected from said plurality of chip patterns; determining on the basis of said measured positions respective values of a plurality of parameters in an operational equation for obtaining the regularity in arrangement of said chip patterns on the corresponding substrate; determining on the basis of said design data and said values of said plurality of parameters the regularity in arrangement of said chip patterns; and moving said substrate in accordance with said determined regularity; and (b) with respect to each of the (m+1)th one and after of said plurality of substrates, measuring actual positions of several selected ones of said plurality of chip patterns; determining on the basis of the last-mentioned measured positions a value of at least one parameter other than specified parameters of said plurality of parameters in said operational equation; determining on the basis of said design data, the value of said at least one parameter and the values of said plurality of parameters determined in step (a) the regularity in arrangement of said chip patterns; and moving said substrate in accordance with said determined regularity.

5. A method according to claim 4, wherein the values of the parameters determined in said step (a) are applied to respective values of said specified parameters so as to determine the regularity in arrangement of said chip patterns with respect to each of the substrates from the (m+1)th and after.

6. A method according to claim 4, wherein an alignment mark attached to each of said plurality of chip patterns is formed on each of said substrates and the positions of said several selected chip patterns are actually measured as deviation from said reference position of said alignment mark.

7. A method according to claim 4, wherein said plurality of parameters includes the rotation error in a surface of a substrate generated in the alignment of said substrate, the offset error corresponding to the shift in a direction of the surface, the scaling error due to the linear expansion and contraction of said substrate itself and the degree of orthogonality of the arrangement of the chip patterns on said substrate.

8. A method according to claim 7, wherein at least one parameter mentioned above for obtaining the regularity of the arrangement of said chip patterns with respect to each of said substrates from the (m+1)th and after includes said rotation error and said offset error.

9. A method for successive alignment of each of a plurality of chip patterns regularly arranged on a substrate in accordance with predetermined coordinates to a reference position, comprising the steps of:

(a) measuring deviations between positions of several chip patterns selected from said plurality of chip patterns and design data representing positions of the selected chip patterns;

(b) determining on the basis of said deviations coefficients of an operational equation so that the sum of the sqaure of deviations between positions of said selected chip pattern determined by use of the operational equation and said design data may be minimum;

(c) determining positions corresponding to said plurality of chip patterns on the basis of said operational equation; and (d) moving said substrate in accordance with the determined positions.

10. A method for successive alignment of each of a plurality of chip patterns regularly arranged on a substrate in accordance with predetermined coordinates to a reference position, comprising the steps of:

(a) with respect to each of several block areas distributed over a surface of said substrate, measuring deviations between positions of several chip patterns selected from chip patterns arranged in the corresponding block area and design data representing positions of the selected several chip patterns;

(b) with respect to said each block area, determining on the basis of said deviations coefficients of an operational equation so that the sum of the square of deviations between positions of said selected chip patterns determined by use of the operational equation and said design data may be minimum;

(c) with respect to said each block area, determining positions corresponding to said chip patterns arranged in the corresponding block area on the basis of said operational equation; and (d) moving said substrate in accordance with the determined positions.

11. A method according to claim 10, wherein said coefficients includes a first parameter dependent upon the rotation error of said substrate relative to said predetermined coordinates, the movement error of said substrate relative to a reference direction and the linear expansion and contraction of said substrate, and a second parameter dependent upon the offset of said substrate relative to said reference position.

12. A method for successive alignment of each of a plurality of chip patterns regularly arranged on a substrate in accordance with predetermined coordinates to a reference position, comprising the steps of:

(a) measuring deviations between positions of several chip patterns selected from said plurality of chip patterns and design data representing positions of said several chip patterns;

(b) detecting from said several chip patterns a chip pattern that is arranged at a position deviated from said design data by an amount larger than a predetermined amount;

(c) with respect to chip patterns of said plurality excepting the detected chip pattern determining on the basis of said deviations coefficients of an operational equation so that the sum of the square of deviations between positions of said remaining chip patterns determined by use of the operational equation and said design data may be minimum;

(c) determining positions corresponding to said plurality of chip patterns including the detected chip pattern on the basis of said operational equation; and (d) moving said substrate in accordance with the determined positions.

13. A method according to claim 12, wherein said coefficients include a first parameter dependent upon the rotation error of said substrate relative to said predetermined coordinates, the movement error of said substrate relative to a reference direction and the linear expansion and contraction of said substrate, and a second parameter dependent upon the offset of said substrate relative to said reference position.

14. A method for successive alignment of each of a plurality of chip patterns regularly arranged on a substrate to a reference position, comprising the steps of:

(a) measuring deviations between positions of said plurality of chip patterns and design data representing positions of said plurality of chip patterns;

(b) detecting a chip pattern that is arranged at a position deviated from said design data by an amount larger than a predetermined amount;

(c) determining, on the basis of said deviations corresponding to chip patterns of said plurality excepting the detected chip pattern, positions corresponding to said plurality of chip patterns including said detected chip pattern; and (d) moving said substrate in accordance with the determined positions.

* * * * *